United States Patent [19]

Palara et al.

[11] 4,368,436

[45] Jan. 11, 1983

[54] OVERLOAD PROTECTION DEVICE FOR POWER OUTPUT CIRCUITS

[75] Inventors: Sergio Palara, Milan; Silvano Tintori, Bergamo, both of Italy

[73] Assignee: SGS-ATES Componenti Elettronici S.p.A., Milan, Italy

[21] Appl. No.: 154,082

[22] Filed: May 28, 1980

[30] Foreign Application Priority Data

Jun. 4, 1979 [IT] Italy ............................... 23235 A/79

[51] Int. Cl.³ ............................................... H03F 21/00
[52] U.S. Cl. ................................. 330/207 P; 330/298; 330/263
[58] Field of Search .................... 330/207 P, 262, 263, 330/298

[56] References Cited

U.S. PATENT DOCUMENTS 3,761,775 9/1973 Ozawa et al. ................... 330/207 P

OTHER PUBLICATIONS

M. Gemmel, "SW Amplifier Assembly in the Thick Layer Technique", *Tech Mitt AEG-Telefunken*, vol. 60, No. 2 (1970).

*Primary Examiner*—James B. Mullins
*Assistant Examiner*—Gene Wan
*Attorney, Agent, or Firm*—Wenderoth, Lind & Ponack

[57] ABSTRACT

A protection device for a power output circuit, designed such that the device protects the power output circuit from damage due to output overloads and simultaneously eliminates the power dissipation of the protected device, thereby conserving power and eliminating unnecessary heating of both the protected device and adjacent components. The protection device includes a comparator for comparing the voltage at the input to the power output circuit with the voltage at the output of the power output circuit. If the power output circuit has a unity voltage gain, its voltage output equals its voltage input under normal operating conditions but its voltage output becomes lower than its voltage input under overload conditions. The comparator is arranged to inhibit the power operation of the power output circuit and reduce its power dissipation to zero when the input voltage of the power output circuit exceeds the output voltage thereof by a specified value, that is, under overload conditions.

12 Claims, 4 Drawing Figures

OVERLOAD PROTECTION DEVICE FOR POWER OUTPUT CIRCUITS

BACKGROUND OF THE INVENTION

1. Field of the Invention

The present invention relates to electronic overload protection devices for circuits containing solid state power components. More particularly, the present invention relates to overload protection devices for power output circuits having a unity voltage gain.

2. Description of the Prior Art

A hitherto known protection device is exemplified by the teachings of Italian Pat. No. 958,867, corresponding to U.S. Pat. No. 3,792,316. According to the teachings of this prior art patent, in order to protect an audio amplifier final stage output transistor, both the current passing through the transistor and the voltage between its collector and emitter terminals are measured. The measured values of the current and voltage thus obtained, whose product corresponds to the instantaneous power dissipated by the transistor, are supplied to a protective circuit connected to the control stage of the transistor. When the measured instantaneous power due to an accidental overload, (e.g.—a short circuit at the output), reaches a predetermined level that could destroy the output transistor, the protective circuit operates the control stage so as to limit the input signal to the transistor, thereby maintaining the output transistor's dissipated power within the safety limits defined by the characteristics of the transistor.

The aforementioned type of prior art device is very suitable for preventing the destruction of the power components of a power output circuit due to an accidental overload but cannot prevent such components from operating at their maximum rated power for the entire period when overload conditions prevail. Such maximum rated power operation of the power output circuit results in a high consumption of energy, which causes overheating of the power output circuit of which the protected power output transistor is a constituent part. In addition, the prolonged continuous operation of the power output circuit at maximum rated power may cause serious damage to the structures adjacent thereto. A typical example where prior art protection devices have proved to be inadequate is in the design of protection devices for use in car radio power output circuits. An accidental short circuit of the power output stage may cause a rapid discharge of the car battery to which the car radio is connected and may result in the burning or destruction of the plastic components adjacent thereto.

SUMMARY OF THE INVENTION

An object of the present invention is to provide an overload protection device for a power output circuit with a unity voltage gain which, during its operation, does not require the dissipation of power by the protected device and thus does not have the drawbacks of the prior art.

A protective device in accordance with the present invention comprises a threshold comparative having first and second input terminals connected, respectively, to the input and the output terminals of the power output circuit; the output terminal of the comparator is connected to an inhibit terminal of the power output circuit; the threshold level of the threshold comparator is selected such that the comparator generates an output signal whenever the difference between the input and output voltages of the power output circuit exceeds a specified value.

BRIEF DESCRIPTION OF THE DRAWINGS

Other features and advantages of the invention will be better understood from the consideration of the ensuing description, and from the attached drawings wherein.

DESCRIPTION OF THE PREFERRED EMBODIMENT

Figure 1:
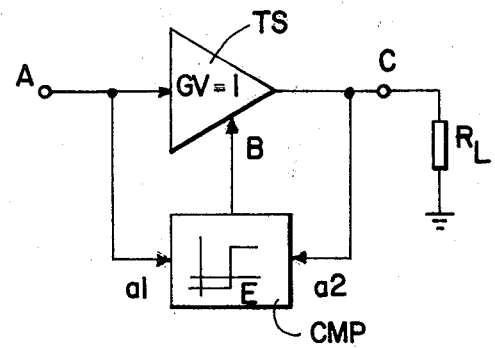
FIG. 1 is a block diagram illustrating the principles of the invention.

In FIG. 1, a power output circuit, e.g., the final stage of a power amplifier or a voltage regulator, is represented by a block element TS having a signal input A, an output C connected to a load $R_L$, and an inhibit terminal B. The two inputs a1 and a2 of a threshold comparator CMP are connected, respectively, to the input A and the output C of element TS, and the output of comparator CMP is connected to the inhibit terminal B of element TS. Element TS is designed so that under a normal load condition, it has a unity voltage gain ($G_V = 1$) and the comparator CMP is arranged so as to generate a signal at its output only when the difference between the voltages applied to inputs a1 and a2 is greater than a specified threshold value E.

As shown in FIG. 1 of the drawings, during normal operation, the input and output terminals of the power output block element TS are at the same voltage levels and, thus, the comparator CMP does not have any effect on the operation of element TS.

However, if the output is overloaded, (e.g.—by an accidental short circuit), the output voltage C tends to be lower than the input voltage A until the voltages present at the input to the comparator CMP meet the conditions for tripping the comparator CMP, that is, $\Delta V = (V_{a1} - V_{a2}) > E$. When $(V_{a1} - V_{a2}) > E$, a signal is produced at the output B which inhibits the operation of the element TS and, consequently, eliminates its power dissipation. Only by removing the overload and restoring the initial conditions of the comparator CMP can the power output element TS be made to resume its normal operation.

The initial conditions of the comparator may be restored either automatically or manually, depending on the requirements of the system to which the protected circuit element TS is a constituent part thereof. In the embodiment of the invention described below, an automatic restoration arrangement will be discussed.

Figure 2:
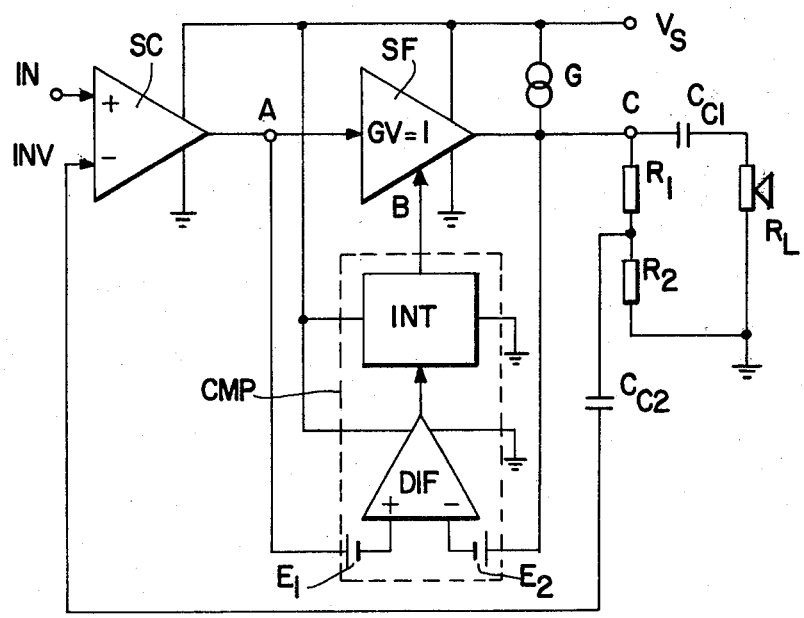
FIG. 2 is a block diagram of an audio amplifier protected by a device embodying the principles of the invention.

In FIG. 2, an audio-frequency amplifier includes a control stage SC having a signal input IN and an inverting signal input INV and further includes a final stage SF having a unity voltage gain, the input A of the final stage SF being connected to the output of the control stage SC. Both stages are supplied with electrical power from a voltage source $V_S$. The output C of the final stage SF is connected to a load $R_L$ (e.g.—a loudspeaker)

by means of a capacitor $C_{c1}$ and to the inverting input INV of the control stage SC by means of a conventional gain-determining network comprising a voltage divider $R_1$, $R_2$, and a capacitor $C_{c2}$. The final stage SF has another input B which, when activated, prevents the final stage from operating.

A comparator circuit CMP, enclosed in dotted lines in FIG. 2 and connected in the same fashion as the comparator CMP shown in FIG. 1, comprises a differential amplifier circuit DIF and an electronic switch circuit INT connected in cascade, both circuits being supplied with electrical power from the voltage source $V_S$. The non-inverting input terminal of differential amplifier circuit DIF, denoted by the symbol "+", is connected to the input A of the final stage SF through a battery $E_1$, and the inverting input terminal of differential amplifier DIF, denoted by the symbol "−," is connected to the output C of the final stage SF through a battery $E_2$.

The voltages $V_1$ and $V_2$ of the batteries $E_1$ and $E_2$ differ from each other by a small positive quantity E, where $E = V_2 - V_1$, so that during normal operation of the amplifier, (that is, when the input voltage $V_A$ and the output voltage $V_C$ of the final stage are approximately equal), the output voltage of the differential amplifier DIF is at a level which does not enable the operation of the electronic switch INT.

When, due to an overload of the final stage SF, the unity gain condition, $(G_V = 1)$, is no longer satisfied such that $V_C < V_A$, the voltage V− at the inverting input "−" of the differential amplifier DIF thus tends to approach the voltage V+ at the non-inverting input "+" of differential amplifier DIF. If the overload is such that:

$$(V_C + V_2) \leq (V_A + V_1),$$

which may also be written:

$$(V_A - V_C) \geq E;$$

then the output of the differential amplifier DIF causes the electronic switch INT to close, thereby activating the inhibit terminal B of the final stage SF. For example, the inhibit control may be designed in such a way as to shunt to ground any signals present at the input terminal A of the final stage SF, so that the final stage SF no longer dissipates power, thus automatically protecting its power components. The value of the threshold voltage E is chosen in dependence upon the maximum authorized dissipation of the power components of the final stage SF and the characteristics of the normal load $R_L$.

For the above-noted circuit to resume its normal operation after the overload conditions have been removed, the voltage V+ at the non-inverting input "+" of the differential amplifier DIF must be lower than the voltage V− at the inverting input "−," that is:

$$(V_A - V_C) < E.$$

Such a condition can be met by applying a direct current either manually or automatically to the final stage SF load which, in the circuit shown in FIG. 2, consists in part of the voltage divider $R_1$, $R_2$, (the voltage divider $R_1$, $R_2$ also serving as part of the feedback path of the final stage SF). The current is applied so that an appropriate voltage level is obtained across the output terminal. As shown in the circuit of FIG. 2, the reset function is performed automatically by the application of a current from a constant current generator G connected between the output terminal C of the final stage SF and the power supply terminal $V_S$. As a modification of the embodiment of FIG. 2, the gain-determining network may be decoupled from the output C. In such a case, the leakage current of the final stage SF may be sufficient to bring the output terminal C to a voltage level which permits the restoration of the normal operating conditions. That is, if the voltage divider $R_1$, $R_2$ illustrated in FIG. 2 is placed directly in parallel with the load $R_L$, (so as to be decoupled by capacitor $C_{c1}$ from the output terminal C), the normal zero voltage quiescent output leakage current of the final stage SF may be sufficient to obviate the need for the constant current generator G.

Figure 3:
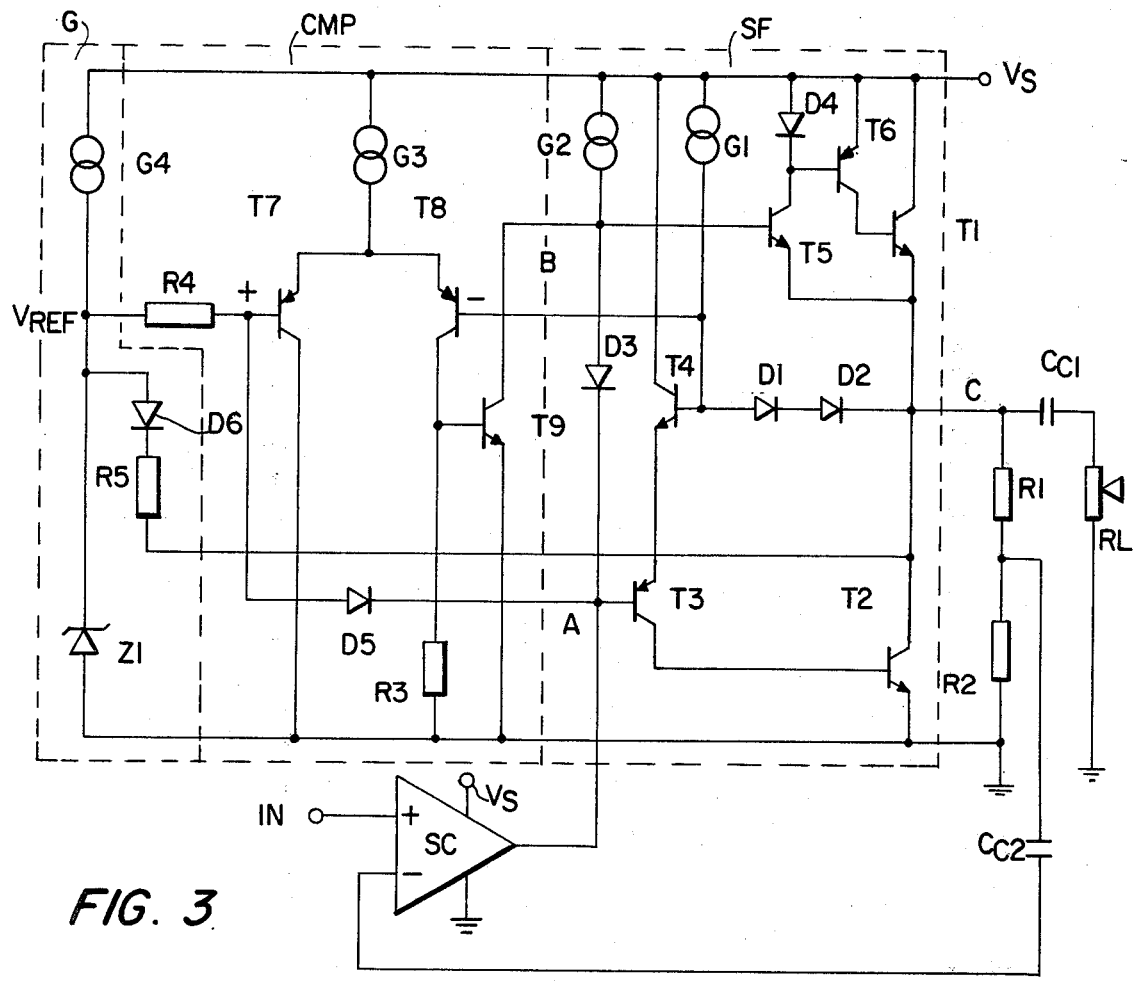
FIG. 3 illustrates a practical embodiment of the present invention, produced by monolithic integrated circuit techniques, of the audio amplifier of FIG. 2.

FIG. 3 shows a circuit embodiment of the block diagram portion of FIG. 2 containing the overload protection device embodying the principles of the present invention. The circuit is particularly suitable for production using monolithic integrated circuit techniques.

The final stage SF contained with the dotted lines in FIG. 3 is a typical class-AB power amplifier circuit with a unity voltage gain. It includes two NPN power transistors T1 and T2; the collector of T1 is connected to the positive terminal $V_S$ of the voltage source and the emitter of T2 is connected to the ground terminal which constitutes the return terminal of the voltage source. The junction point of the emitter of T1 and the collector of T2 is the output terminal C of the final stage amplifier SF. The input A of the final stage SF, which is connected to the output of the control stage SC, comprises the base of a PNP transistor T3, the collector of which is connected to the base of transistor T2 and the emitter of which is connected to the emitter of an NPN transistor T4. The collector of transistor T4 is connected directly to the positive voltage source terminal $V_S$ and its base is connected to the positive voltage source terminal $V_S$ by means of a constant current generator G1 and to the output terminal C by means of two series connected diodes D1 and D2. The base of transistor T3 is connected, through a diode D3, to both a constant current generator G2 and to the base of an NPN transistor T5. The second terminal of the constant current generator G2 is connected to the power supply $V_S$. The emitter of transistor T5 is connected to the output terminal C and its collector is connected, through a diode D4, to terminal $V_S$. The collector of transistor T5 is also connected to the base of a PNP transistor T6. The emitter of transistor T6 is connected to the terminal $V_S$ and its collector is connected to the base of transistor T1.

During normal operation, when the positive half-wave of a sinusoidal audio signal to be amplified is present at the input terminal A, a current passes through diode D3 and the emitter-base junction of transistor T5. Therefore, a collector current flows in transistor T5 which, by means of the current mirror formed by diode D4 and transistor T6, induces a base current in the power transistor T1, rendering it conductive. Since the transistor T3 remains in a non-conducting state, the power transistor T2 remains in a non-conducting state.

During the negative half-wave cycle of the audio signal present at the input terminal A, transistor T5 is back-biased in its non-conducting state and, thus, the power transistor T1 is rendered non-conducting. However, the emitter-base junction of transistor T3 becomes forward-biased. Therefore, transistor T3 becomes conductive, together with transistor T4 and enables the forward-biasing of transistor T2. In this way, an amplified audio signal is outputted to the load RL through capacitor $C_{c1}$.

As is well known to those skilled in the amplifier art, the diodes D1 and D2 perform the following functions:

(1) bias the final stage so that it operates as an AB class amplifier in order to remove cross-over distortion;

(2) form a path for the current from the generator $G_1$ when transistors T3 and T4 are back-biased; and (3) compensate for the base-emitter voltage drops of transistors T3 and T4 in order to keep the input A and the output C at the same voltage levels.

The differential amplifier DIF of the comparator CMP contained within the dotted lines in FIG. 3 consists of two NPN transistors T7 and T8, the emitters of which are connected together to the positive voltage source terminal $V_S$ through a constant current generator G3. The collector of T7 is connected directly to ground and the collector of T8 is grounded through a resistor R3. The base of T8, which is the inverting input "−" of the differential amplifier DIF, is connected to the base of transistor T4; the base of transistor T7, which is the non-inverting input "+" of the differential amplifier DIF, is connected through a resistor R4 to a reference voltage point having a voltage $V_{REF}$ determined by a Zener diode Z1 in series with a constant current generator G4 which supplies the Zener diode Z1 with a current of sufficient magnitude to maintain the diode in its Zener conducting state. The base of transistor T7 is also connected to the input terminal A of the final stage through a diode D5. A diode D6 and a resistor R5 are connected in series between the reference voltage point having the voltage $V_{REF}$ and the output terminal C of the final stage. The collector of transistor T8, which is the output of the differential amplifier DIF, is connected to the base of an NPN transistor T9. The emitter of transistor T9 is connected to ground and its collector is connected to terminal B of the final stage SF which is connected to the base of transistor T5.

It should be noted that the battery $E_2$ shown in FIG. 2 comprises the two series-connected diodes D1 and D2 of FIG. 3, that is, in this instance the voltage $V_2$ is generated by the voltage drop across the two forward-biased diodes. Similarly, the voltage $V_1$ of the battery $E_1$ of FIG. 2 is generated by the voltage drop across the forward-biased diode D5 of FIG. 3, such that $V_2/2 \dot{=} V_D$, where $V_D$ equals the normal voltage across a forward-biased diode. The electronic switch INT of FIG. 2 comprises the transistor T9 of FIG. 3, and the generator G of FIG. 2 comprises generator G4, Zener diode Z1, diode D6 and resistor R5.

The operation of the circuit of FIG. 3 under normal and overload conditions will be discussed below.

Under normal conditions, during the positive half-wave cycle of the input signal, the following relationships are valid:

$$V- = V_C + 2V_D;$$

$$V+ = V_{REF} + I_B R_4;$$

where $I_B$ is the base current of the transistor T7. In the following calculations, the voltage term $I_B R_4$ will be omitted, since the resistor R4 is chosen such that the voltage drop across it is negligible in all practical instances. Since $V_C \geq V_S/2$, it is sufficient to select $V_{REF}$ in such a way that $V+ < V-$, thus forward-biasing transistor T7 and back-biasing transistor T8. Consequently, transistor T9 is back-biased so that the operation of the final stage will not be affected by the comparator CMP.

During the negative half-wave cycle of the input signal, the following relationships are valid:

$$V- = V_C + 2V_D;$$

$$V+ \dot{=} V_{REF}, \text{ or}$$

$$V+ = V_A + V_D, \text{ when the input voltage } V_A < (V_{REF} - V_D).$$

Thus, when $V+ \dot{=} V_{REF}$, the same situation exists as that described above with reference to the positive half-wave cycle of the input signal, and when $V+ = V_A + V_D$, bearing in mind that $V_A \dot{=} V_C$, the relationship $V+ = < V-$ is still valid, so that the output of the differential amplifier will still be such as to back-bias transistor T9.

The overload conditions caused by the shorting to ground of the output terminal C will now be discussed.

It will readily be seen that the final transistor T2 is not in any danger of destruction because it is shunted by the short circuit itself. Instead, transistor T1 would tend to carry a rapidly incrasing current which, if it were not for the protection circuit, would soon exceed the safety limits and destroy the transistor. As soon as the output terminal C is shorted to ground, the final stage is unbalanced and, because of the negative feedback (through R1, R2 and C2), no feedback current is inputted to point A from stage SC. Under these conditions, the following relationships will prevail at the inputs of the differential amplifier circuit:

$$V- = 2V_D; \text{ and}$$

$$V+ \dot{=} V_{REF},$$

so that transistor T7 will be switched to the back-biased off-state and transistor T8 will be switched to the forward-biased on-state. The voltage drop across the resistor R3 forward-biases the transistor T9 so that point B is actually shunted to ground by transistor T9. The transistor T5 is switched to the back-biased off-state and, therefore, the power transistor T1 is also rendered back-biased and therefore non-conductive. Thus, the final stage is protected in the best possible way, since it no longer dissipates power.

As soon as the short is removed, a current $I \dot{=} V_{REF}/R_5$ is supplied to the voltage divider R1, R2 through the diode D6 and the resistor R5. The components are so selected that the current I generates a voltage across the output terminal C which is greater than $(V_{REF} - 2V_D)$, so that the differential amplifier DIF returns to the state it occupied prior to the short and the amplifier resumes its normal operation.

The operation of the device embodying the principles of the invention has been described, with allowances being made for the greatest possible overload, that is to say, a short at the output. However, a person skilled in the electronic circuitry art will readily see that the protection circuit operates in the same manner when the overload is less severe and that the scope of protection afforded by the device is determined by the current gain of the final stage.

Figure 4:
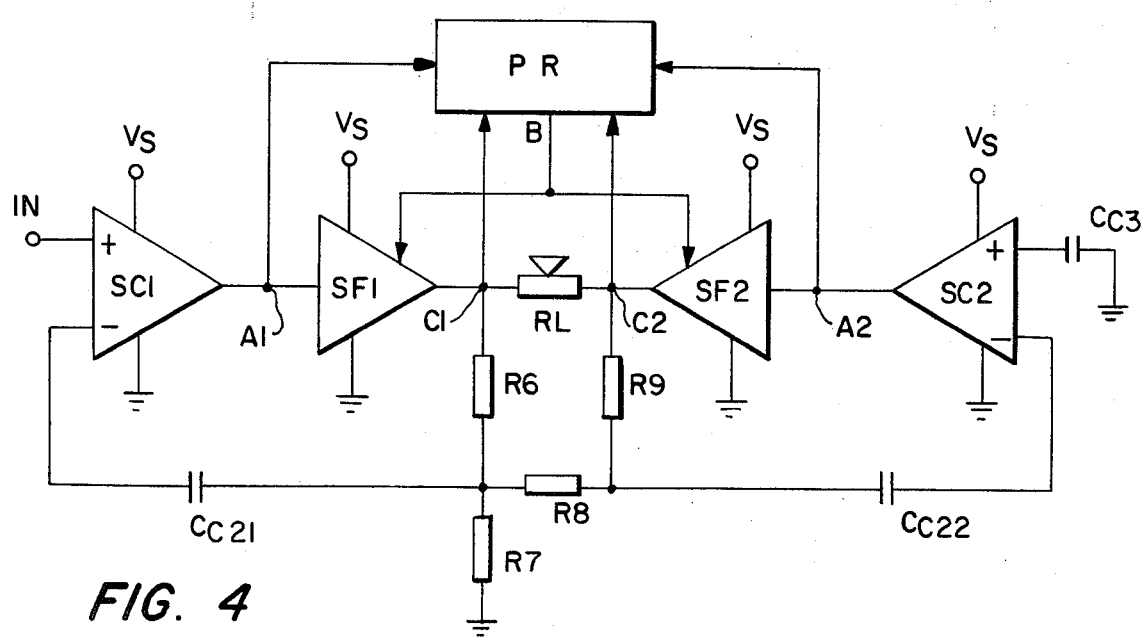
FIG. 4 is a block diagram of one advantageous application of the present invention.

The block diagram of FIG. 4 shows an audio power amplifier in what is known as a "bridge configuration," which essentially consists of two amplifiers SF1 and SF2 identical to those of FIG. 3, and in which the outputs of the two amplifiers are connected to the terminals of the load RL. The same symbols of FIGS. 2 and 3, with the addition of the suffixes "1" and "2," have been used to identify the various blocks and points of connection. The protection device represented by a single block PR actually comprises two interconnected comparators CMP of the type described above with reference to FIGS. 2 and 3. Resistors R6–R9 and capacitors $C_{c21}$ and $C_{c22}$ form the negative feedback determinative elements of the two amplifiers SF1 and SF2 illustrated in FIG. 4, (in an equivalent fashion to the resistive elements R1, R2 and capacitor $C_{c2}$ of the single output stage SF illustrated in FIG. 3). Capacitor $C_{c3}$ grounds the non-inverting "+" input of control stage SC2 for AC signals. The inverting "−" input of the control stage SC2 effectively receives a portion of the input signal IN through the same resistive network R6–R9 also utilized as a portion of the negative feedback determinative circuit. Such a "bridge configuration" circuit is quite conventional and accordingly, a detailed description of the operation of the control stages SC1 and SC2 and the final output stages SF1 and SF2 have not been provided.

In the event of a short to ground at one of the outputs C1 and C2, the protection device PR operates as described earlier, not only for the final stage whose output is shorted to ground but also for the other final stage, so that the load RL is also protected. That is, there is only a single inhibit output B of protection device PR which inhibits the operation of both final stages simultaneously, irrespective of which final stage output is shorted to ground. Furthermore, if the short occurs across the load RL, it will be detected by the protection device PR as an overload and both final stages SF1 and SF2 will be turned off. In actuality, the single inhibit output B is connected to the inhibit input terminals of amplifiers SF1 and SF2 through series diodes, (not shown); the series diodes provided to isolate the two amplifiers from each other.

While only two embodiments of the present invention has been illustrated and described, it will be understood that the invention is not limited thereto, since many modifications may be made, and the appended claims are therefore contemplated to cover any such modifications as fall within the true spirit and scope of the present invention.

We claim:

1. An overload protection device for a power output circuit, said power output circuit having a voltage gain substantially equal to one under normal load conditions and having an input terminal, an output terminal, and an inhibit terminal, said overload protection device comprising;

a threshold comparator having first and second input terminals respectively adapted to be connected to said input and output terminals of said power output circuit and having an output terminal adapted to be connected to said inhibit terminal of said power output circuit;

wherein the threshold of said comparator is arranged such that said comparator generates a signal at its output terminal for inhibiting the operation of said power output circuit and reducing its power dissipation to a value substantially equal to zero whenever the difference between the voltage at said input terminal and the voltage at said output terminal of said power output circuit exceeds a specified value, whereby the power output circuit is protected from output overloads;

further comprising a restoring means for automatically restoring the operation of said power output circuit subsequent to its being inhibited by said comparator, said restoring means comprising a DC load adapted to be connected to said output terminal of said power output circuit, and a current generator connected to said DC load, wherein the magnitude of the current generated by said current generator is sufficient to cause a voltage drop across said DC load which is greater than said specified threshold value of said comparator.

2. An overload protection device as claimed in claim 1, for a power output circuit which comprises the final stage of an audio amplifier, wherein said comparator comprises:

a differential amplifier having first and second input terminals and an output terminal;

an electronic switch having an input terminal connected to said output terminal of said differential amplifier and having an output terminal adapted to be connected to said inhibit terminal of said power output circuit and controlled by the output of said differential amplifier circuit; and a biasing means for biasing said first and second input terminals of said differential amplifier circuit such that during the normal operation of said power output circuit, the voltage at said output terminal of said power output circuit exceeds the voltage at said input terminal of said power output circuit by said specified threshold value.

3. The overload protection device as claimed in claim 2, for a power output circuit which comprises a push-pull class-AB type audio amplifier, wherein said biasing means comprises a reference voltage generator means operatively connected to said first input terminal of said differential amplifier circuit being adapted to be operatively connected to said input terminal of said power output circuit, and said second input terminal of said differential amplifier being adapted to be operatively connected to said output terminal of said power output circuit by circuit element means for removing crossover distortion in said power input circuit.

4. An overload protection device as claimed in claims 2 or 3, further comprising a voltage power supply having first and second terminals, and wherein said differential amplifier comprises:

first and second transistors, the collector of said first transistor connected to said second power supply terminal and the collector of said second transistor operatively connected to said second power supply terminal through a first resistor, the emitters of said first and second transistors operatively connected to said first power supply terminal by a first current source;

wherein said first and second input terminals of said differential amplifier comprise the bases of said first and second transistors; and wherein said output terminal of said differential amplifier comprises the collector of said second transistor.

5. An overload protection device as in claim 4, wherein said electronic switch comprises a third transistor, the emitter of said third transistor connected to said second power supply terminal, the base of said third transistor connected to said output terminal of said differential amplifier, and wherein the collector of said third transistor comprises the output terminal of said electronic switch.

6. An overload protection device as in claim 4, wherein said biasing means comprises a Zener diode having a first terminal operatively connected to said second power supply terminal and having a second terminal operatively connected to said first power supply terminal through a second current source, and further comprising a diode-resistor string, including a diode in series with a resistor, a first terminal of said diode-resistor string connected to said second terminal of said Zener diode and a second terminal of said diode-resistor string adapted to be connected to the output of said power output circuit;

said biasing means further comprising a pair of additional diodes connected in series and having first and second terminals, said first terminal of said series pair of additional diodes operatively connected to said first power supply terminal through a third current source, and said second terminal of said series pair of additional diodes adapted to be connected to said output of said power output circuit.

7. A system comprising in combination:

a power output circuit having a voltage gain substantially equal to one under normal load conditions and having an input terminal, an output terminal, and an inhibit terminal;

and an overload protection device for protecting said power output circuit, said protection device comprising:

a threshold comparator having first and second input terminals respectively connected to said input and output terminals of said power output circuit and having an output terminal connected to said inhibit terminal of said power output circuit;

wherein the threshold of said comparator is arranged such that said comparator generates a signal at its output terminal for inhibiting the operation of said power output circuit and reducing its power dissipation to a value substantially equal to zero whenever the difference between the voltage of said input terminal and the voltage of said output terminal of said power output circuit exceeds a specified value, whereby the power output circuit is protected from output overload;

further comprising a restoring means for automatically restoring the operation of said power output circuit subsequent to its being inhibited by said comparator, said restoring means comprising a DC load connected to said output terminal of said power output circuit, and a current generator connected to said DC load, wherein the magnitude of the current generated by said current generator is sufficient to cause a voltage drop across said DC load which is greater than said specified threshold value of said comparator.

8. A system as claimed in claim 7, wherein said power output circuit comprises the final stage of an audio amplifier, and wherein said comparator comprises:

a differential amplifier having first and second input terminals and an output terminal;

an electronic switch having an input terminal connected to said output terminal of said differential amplifier and having an output terminal connected to said inhibit terminal of said power output circuit and controlled by the output of said differential amplifier circuit; and biasing means for biasing said first and second input terminals of said differential amplifier circuit such that during the normal operation of said power output circuit, the voltage of said output terminal of said power output circuit exceeds the voltage of said input terminal of said power output circuit by said specified threshold value.

9. The system as claimed in claim 8, wherein said power output circuit comprises a push-pull class-AB type audio amplifier, and wherein said biasing means comprises a reference voltage generator means operatively connected to said first input terminal of said differential amplifier circuit, said first input terminal of said differential amplifier circuit connected to said input terminal of said power output circuit and said second input terminal of said differential amplifier connected to said output terminal of said power output circuit by circuit element means for removing crossover distortion in said power output circuit.

10. A system as claimed in claim 8 or 9, further comprising a voltage power supply having first and second terminals, and wherein said differential amplifier comprises:

first and second transistors, the collector of said first transistor connected to said second power supply terminal and the collector of said second transistor operatively connected to said second power supply terminal through a first resistor, the emitters of said first and second transistors operatively connected to said first power supply terminal by a first current source;

wherein said first and second input terminals of said differential amplifier comprise the bases of said first and second transistors; and wherein said output terminal of said differential amplifier comprises the collector of said second transistor.

11. A system as claimed in claim 10, wherein said electronic switch comprises a third transistor, the emitter of said third transistor connected to said second power supply terminal, the base of said third transistor connected to said output terminal of said differential amplifier, and wherein the collector of said third transistor comprises the output terminal of said electronic switch.

12. A system as claimed in claim 10, wherein said biasing means comprises a Zener diode having a first terminal operatively connected to said second power supply terminal and having a second terminal operatively connected to said first power supply terminal through a second current source, and further comprising a diode-resistor string, including a diode in series with a resistor, a first terminal of said diode-resistor string connected to said second terminal of said Zener diode and a second terminal of said diode-resistor string connected to the output of said power output circuit;

said biasing means further comprising a pair of additional diodes connected in series and having first and second terminals, said first terminal of said series pair of additional diodes operatively connected to said first power supply terminal through a third current source, and said second terminal of said series pair of additional diodes connected to said output of said power output circuit.

* * * * *